United States Patent
Imafuku

(10) Patent No.: US 11,403,548 B2
(45) Date of Patent: Aug. 2, 2022

(54) METHOD FOR QUANTUM ANNEALING COMPUTATION

(71) Applicant: National Institute of Advanced Industrial Science and Technology, Tokyo (JP)

(72) Inventor: Kentaro Imafuku, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 539 days.

(21) Appl. No.: 16/598,265

(22) Filed: Oct. 10, 2019

(65) Prior Publication Data
US 2020/0042894 A1    Feb. 6, 2020

Related U.S. Application Data

(63) Continuation-in-part of application No. PCT/JP2018/009994, filed on Mar. 14, 2018.

(30) Foreign Application Priority Data

Apr. 13, 2017  (JP) .............................. JP2017-079583

(51) Int. Cl.
*G06N 10/00*     (2022.01)
(52) U.S. Cl.
CPC .................................... *G06N 10/00* (2019.01)
(58) Field of Classification Search
CPC ........................................................ G06N 10/00
USPC ........................................................ 708/200
See application file for complete search history.

(56) References Cited

U.S. PATENT DOCUMENTS

2013/0282636 A1* 10/2013 Macready .............. B82Y 10/00
706/46

FOREIGN PATENT DOCUMENTS

JP      2009-524857     7/2009
WO    2007/085074     8/2007

OTHER PUBLICATIONS

International Search Report, dated Jul. 31, 2018 (Jul. 31, 2018), 1 page.

* cited by examiner

*Primary Examiner* — Tomi Skibinski
(74) *Attorney, Agent, or Firm* — Rankin, Hill & Clark LLP

(57) ABSTRACT

A method for performing quantum annealing computation for solving a discrete optimization problem includes the steps of: (a) identifying an operation for transferring an energy state of one of two physical systems (u, d) having the same quantum state to a low energy state and transferring an energy state of the other of the two physical systems to a high energy state; (b) constructing a network structure among a plurality of physical systems that indicates an order of application of the operation of the step (a) on two physical systems among the plurality of physical systems; and (c) obtaining a physical system having a minimum energy state in the plurality of physical systems by applying the operation of the step (a) to the plurality of physical systems according to the order indicated in the network structure of step (b).

5 Claims, 9 Drawing Sheets

METHOD FOR QUANTUM ANNEALING COMPUTATION

BACKGROUND OF THE INVENTION

Field of the Invention

The present invention relates to a method for quantum annealing computation, and more particularly, to a method for performing quantum annealing computation to solve a discrete optimization problem using a quantum annealing computer.

Description of the Related Art

A quantum annealing computer is known as a quantum computer that solves a discrete optimization problem using a quantum effect. The quantum annealing computer is a computer for solving a problem (hereinafter referred to as a "discrete optimization problem") of obtaining a combination of discrete variables that minimizes an objective function (corresponding to optimization), which frequently appears in operation research or the like.

A physical system is designed in which a discrete variable is a physical state and a value of an objective function with respect to the discrete variable becomes the energy of the state. That is, energy is a function of the state. Thus, when the physical system can be transferred to a lowest energy state by any method, an optimum solution can be obtained by measuring the state. Quantum annealing using a quantum mechanical effect is known as a mechanism for transferring the physical system to the lowest energy state. It is known that the quantum annealing may solve a problem more efficiently than those that do not use the quantum mechanical effect.

In the quantum annealing, correspondence between the energy and the state is gradually changed in time by controlling an external field (potential) acting on a system. An initial potential having a self-evident lowest energy state is selected. The quantum annealing is designed to change the potential and to finally achieve a relationship between the energy and the state corresponding to an objective function for which the optimum solution is actually investigated. When the initial state of the system is prepared to be the lowest energy state determined by the initial potential and then the potential is changed sufficiently slowly, the state traces the lowest energy state determined by the potential at each moment, which is known as a result of quantum mechanics. In this manner, it is possible to obtain a state that minimizes the objective function to be finally examined.

A fact that the state traces the lowest energy state when the time change in the potential is slow is generally known as an adiabatic theorem in quantum mechanics, and the computation method is also known as adiabatic quantum computation. As an example, in JP-A-2009-524857, disclosed is a method for the adiabatic quantum computation using a quantum system including a plurality of superconducting qubits. In the adiabatic quantum computation, a quantum mechanical state (a state that cannot be expressed by ordinary classical physics) appears in a state that appears in a computation process. Therefore, the computation method may solve the problem more efficiently than an ordinary computer using classical physics as an implementation principle.

SUMMARY OF THE INVENTION

In conventional quantum annealing computation shown in JP-A-2009-524857, a time change in potential must be slow so that an adiabatic theorem can be established. For this reason, the computation cannot be accelerated beyond the limit. In particular, when a size of a problem to be solved is big, there exists a problem (bottleneck) that an expectation value of computation time increases exponentially with respect to a size of the problem.

An object of the present invention is not only to propose a method different from the conventional method using the adiabatic theorem, as a mechanism for guiding a physical state to the lowest energy state, but also to avoid the above-described bottleneck problem.

The present invention provides a method for performing quantum annealing computation to solve a discrete optimization problem. The method including the following (ii) as a basic idea includes:

(i) defining an energy function (problem Hamiltonian H) so that a solution of a problem becomes a lowest energy state;

(ii) repeatedly applying a method for transferring an energy state of one of two physical systems having the same quantum state to a low energy state and transferring an energy state of the other of the two physical systems to a high energy state, to the two physical systems among a plurality of systems; and (iii) determining the lowest energy state which is the solution to the problem.

A method of the present invention for performing quantum annealing computation to solve a discrete optimization problem using a quantum annealing computer, the method including the step of;

(a) identifying an operation for transferring an energy state of one of two physical systems (u, d) having the same quantum state to a low energy state and transferring an energy state of the other of the two physical systems to a high energy state;

(b) constructing a network structure among a plurality of physical systems that indicates an order of application of the operation of the step (a) on two physical systems among the plurality of physical systems; and (c) obtaining a physical system having a minimum energy state in the plurality of physical systems by applying the operation of the step (a) according to the order indicated in the network structure of step (b).

As an example, when the method of the present invention is applied to a search problem of a search space $2^n$, the number of computation steps can be suppressed to a highly polynomial (second order ($n^2$)) increase with respect to n. Further, when the conventional method for quantum annealing computation and a conventional method for gate type quantum computation are applied, the number of computation steps increases exponentially ($2^{n/2}$) with respect to n, whereas according to the method of the present invention, the number of computation steps can be significantly reduced. Further, when the method of the present invention is used to solve the problem, the method of the present invention allows solving the problem by the number of computation steps and the required number of quantum bits with a highly polynomial size (second order ($n^2$)) with respect to n. As a result, an increase in computation time according to the size of the problem can be suppressed.

DESCRIPTION OF THE PREFERRED EMBODIMENTS

Figure 1:
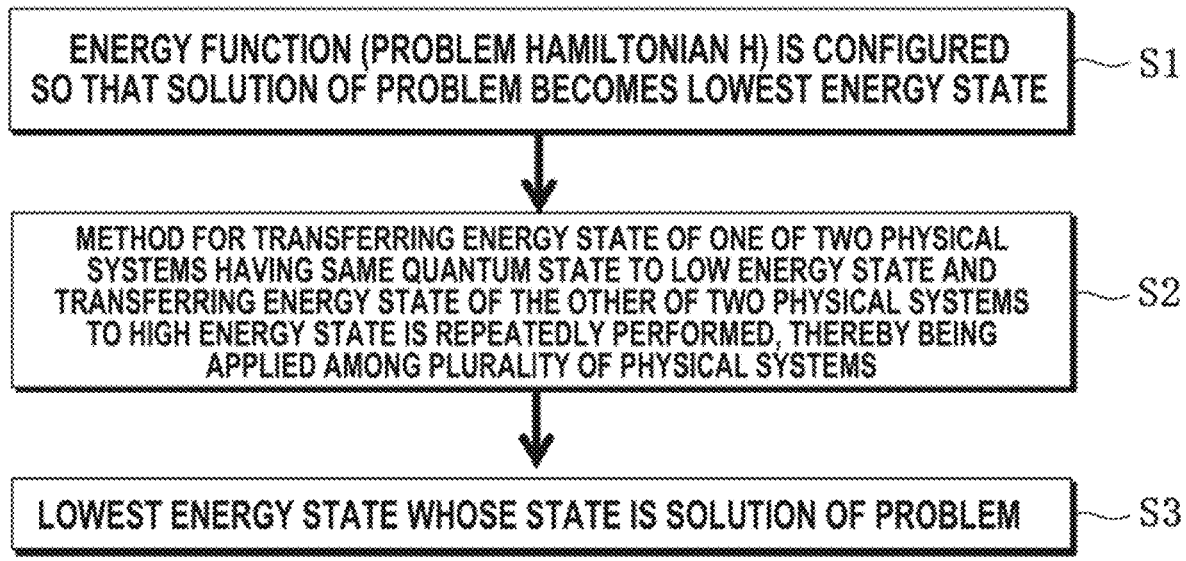
FIG. 1 is a diagram illustrating an outline of an example of a computation method including a main part of an algorithm of a method of the present invention.

An embodiment of the present invention (a method for performing quantum annealing computation to solve a discrete optimization problem using a quantum annealing computer) will be described with reference to the accompanying drawings. FIG. 1 is a diagram illustrating an outline of an example of a computation method including a main part of an algorithm of the method. In an outline of the computation method in FIG. 1, first, an energy function (problem Hamiltonian H) is defined so that a solution of a problem becomes a lowest energy state (S1). Next, a method for transferring an energy state of one of two physical systems having the same quantum state to a low energy state and transferring an energy state of the other of the two physical systems to a high energy state is repeatedly applied the two physical systems among the plurality of physical systems (S2). As a result, the lowest energy state whose state is the solution of the problem can be obtained (S3).

Figure 2:
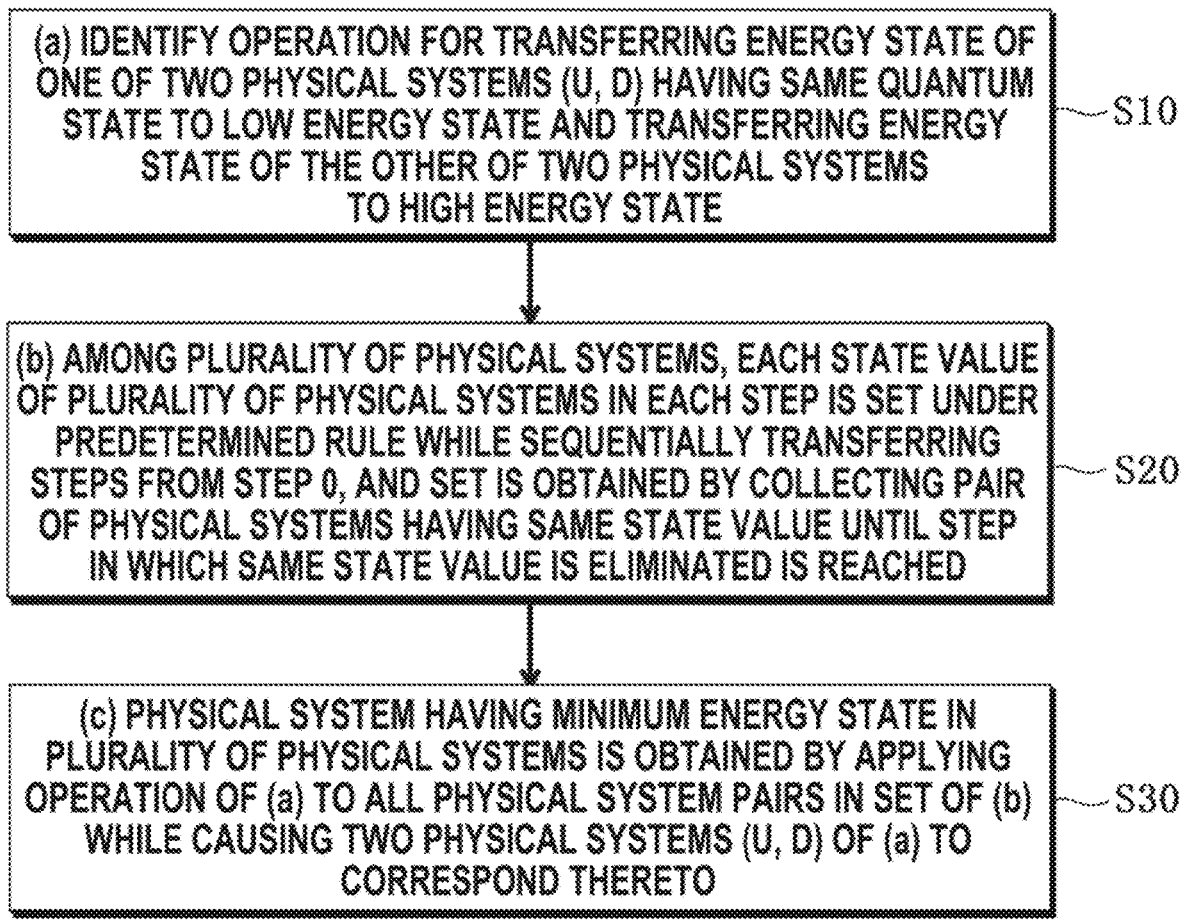
FIG. 2 is a diagram illustrating a flow of one embodiment of the method of the present invention.

FIG. 2 is a diagram illustrating a flow of one embodiment of the method for performing the quantum annealing computation of the present invention. As step S10, an operation for transferring an energy state of one of two physical systems (u, d) having the same quantum state to a low energy state and transferring an energy state of the other of the two physical systems (u, d) to a high energy state is identified. As step S20, among the plurality of physical systems, each state value of the plurality of physical systems in each step is set under a predetermined rule while sequentially transferring steps from step 0 which will be described later, and a set is obtained by collecting a pair of physical systems having the same state value until reaching a step in which a pair of physical systems having the same state value is eliminated. In other words, in step S20, a network structure (refer to FIG. 5 which will be described later) among the plurality of physical systems that indicates an order of application of the operation of step S10 on two physical systems among the plurality of physical systems is constructed. In step S30, a physical system having a minimum energy state in the plurality of physical systems is obtained by applying step 10 to the plurality of physical systems according to the order indicated in the network structure of step 20.

Figure 3:
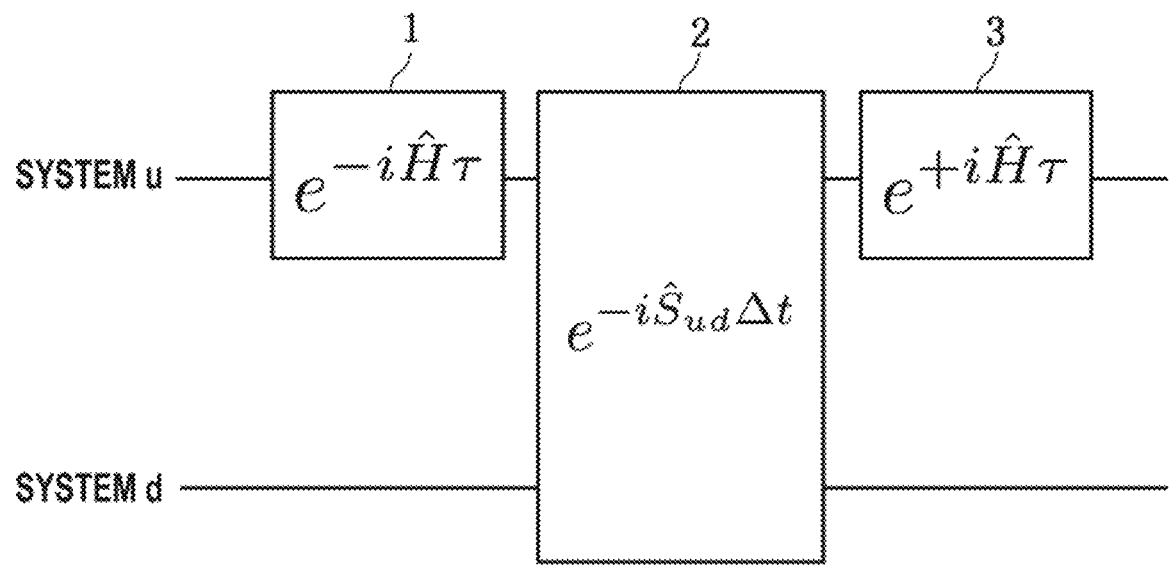
FIG. 3 is a conceptual diagram of an operation (step S10 in FIG. 2) for transferring an energy state of one embodiment of the method of the present invention.

An operation for transferring the energy state of step S10 in FIG. 2 will be described in detail with reference to FIG. 3. FIG. 3 is a conceptual diagram of an operation (step S10 in FIG. 2) for transferring an energy state of one embodiment of the method of the present invention. First, the same quantum state indicated in the following (1) is prepared as an initial state in the two physical systems (u, d).

$$|\varphi_0\rangle\langle\varphi_0| \quad (1)$$

At this point of time, the physical system u and the physical system d have the same expectation value of energy indicated in the following (2).

$$\langle\varphi_0|\hat{H}|\varphi_0\rangle \quad (2)$$

Next, dispersion of energy in a quantum state of (1) is given by the following equation (3).

$$\Delta E = \langle\varphi_0|\hat{H}^2|\varphi_0\rangle - \langle\varphi_0|\hat{H}|\varphi_0\rangle^2 \quad (3)$$

As a "first operation 1", time evolution of the quantum state of the physical system u is performed for time τ (>0) using a Hamiltonian indicated in the following (4). A block denoted by a reference sign 1 in FIG. 3 indicates the first operation 1.

$$\hat{H} \quad (4)$$

As a "second operation 2", a quantum swapping operation is performed between the physical system u and the physical system d for time Δt (>0). A block denoted by a reference sign 2 in FIG. 3 indicates the second operation 2.

As a "third operation 3", time evolution of the quantum state of the physical system u is performed for time τ (>0) using an inverted Hamiltonian indicated in the following (5). A block denoted by a reference sign 3 in FIG. 3 indicates the third operation 3.

$$-\hat{H} \quad (5)$$

As a result of quantum mechanical time evolution defined by the operations, in the quantum states of the physical system u and the physical system d after the first to third operations in a series are performed, the quantum state of the physical system u can be represented by the following equation (6), and the quantum state of the physical system d can be represented by the following equation (7) in the approximate range up to the first order of τ and Δt.

$$\rho_u = |\varphi_0\rangle\langle\varphi_0| + \tau[[\hat{H},|\varphi_0\rangle\langle\varphi_0|],|\varphi_0\rangle\langle\varphi_0|]\Delta t \quad (6)$$

$$\rho_d = |\varphi_0\rangle\langle\varphi_0| - \tau[[\hat{H},|\varphi_0\rangle\langle\varphi_0|],|\varphi_0\rangle\langle\varphi_0|]\Delta t \quad (7)$$

Here, in consideration of solution (9) of the following nonlinear equation (8), $$\frac{d}{dt}(|\varphi_t\rangle\langle\varphi_t|) = -\tau[[\hat{H},|\varphi_t\rangle\langle\varphi_t|],|\varphi_t\rangle\langle\varphi_t|] \quad (8)$$

$$|\varphi_t\rangle\langle\varphi_t| \quad (9)$$

It can be seen that the following equations (10) and (11) are established in the approximate range up to the first order of τ and Δt.

$$\rho_u = |\varphi_{t=-\Delta t}\rangle \langle \varphi_{t=-\Delta t}| \quad (10)$$

$$\rho_d = |\varphi_{t=|\Delta t}\rangle \langle \varphi_{t=|\Delta t}| \quad (11)$$

An expectation value of energy of the following (12) in a state given in the above-described (9) is monotonously decreasing with respect to t.

$$tr(\hat{H}|\varphi_t\rangle \langle \varphi_t|) \quad (12)$$

An expectation value of energy in the state after the first to third operations is represented by the following equation (13) with respect to the physical system u, and is higher than an expectation value in the initial state by ΔEτΔt.

$$tr(\hat{H}\rho_u) = \langle \varphi_0|\hat{H}|\varphi\rangle + \tau\Delta E\Delta t \quad (13)$$

On the other hand, the expectation value of energy is represented by the following equation (14) with respect to the physical system d, and is lower than the expectation value in the initial state by ΔEτΔt.

$$tr(\hat{H}\rho_d) = \langle \varphi_0|\hat{H}|\varphi_0\rangle - \tau\Delta E\Delta t \quad (14)$$

As described above, it can be seen that the physical system u is transferred to the high energy state and the physical system d is transferred to the low energy state by the first to third series of operations.

Figure 4:
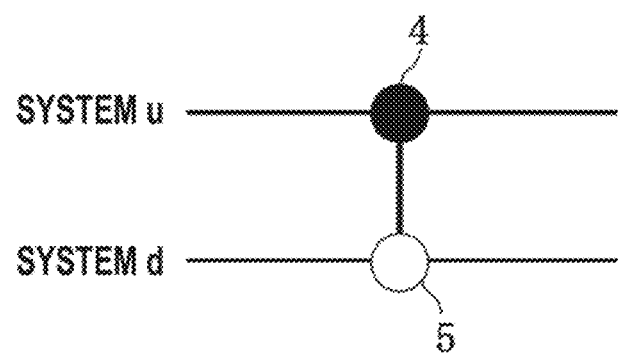
FIG. 4 is a schematic diagram of the conceptual diagram in FIG. 3.
Figure 5:
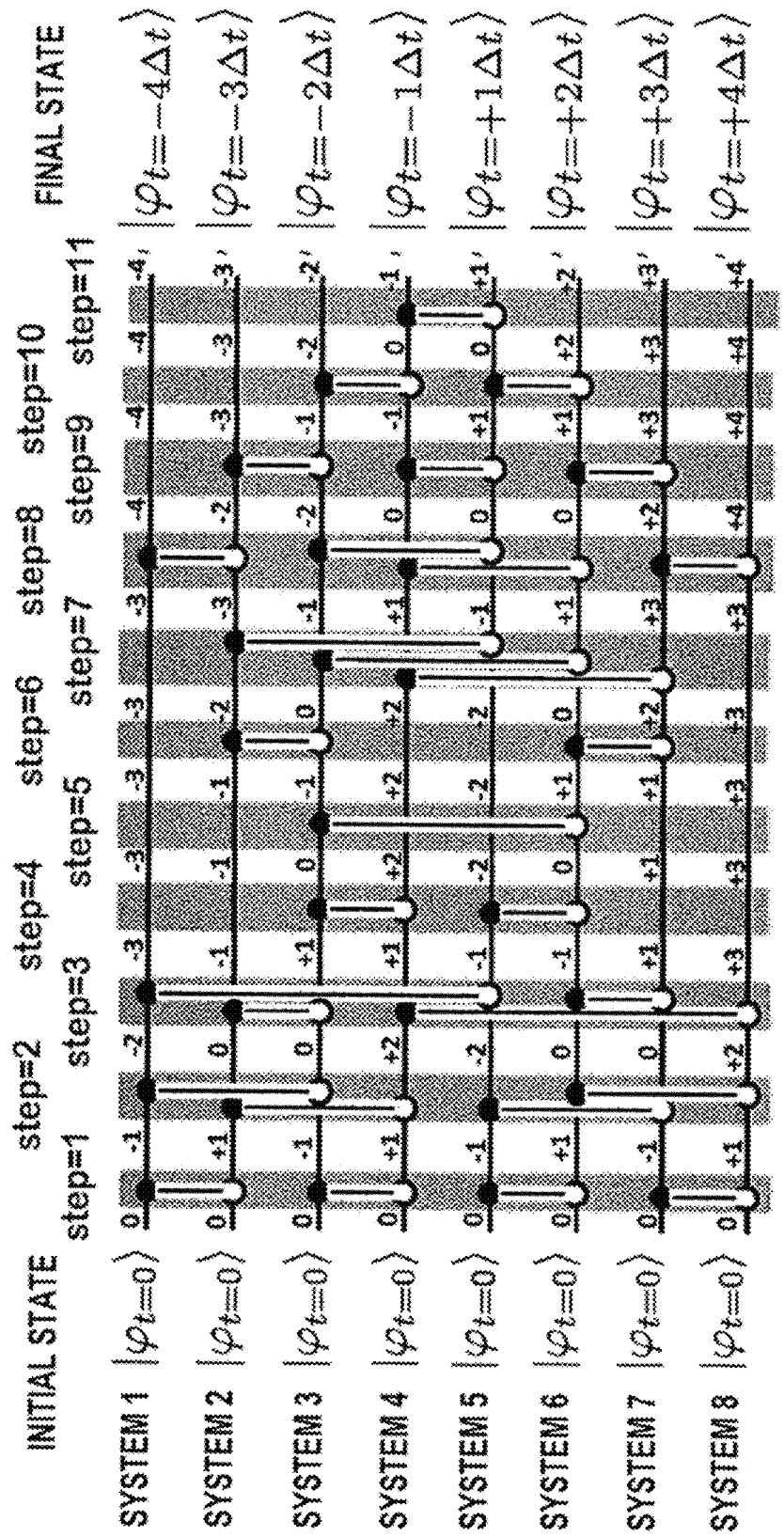
FIG. 5 is a diagram illustrating step S20 of obtaining a set of one embodiment of the method of the present invention and step S30 of obtaining a physical system having a minimum energy state among a plurality of physical systems.
Figure 6:
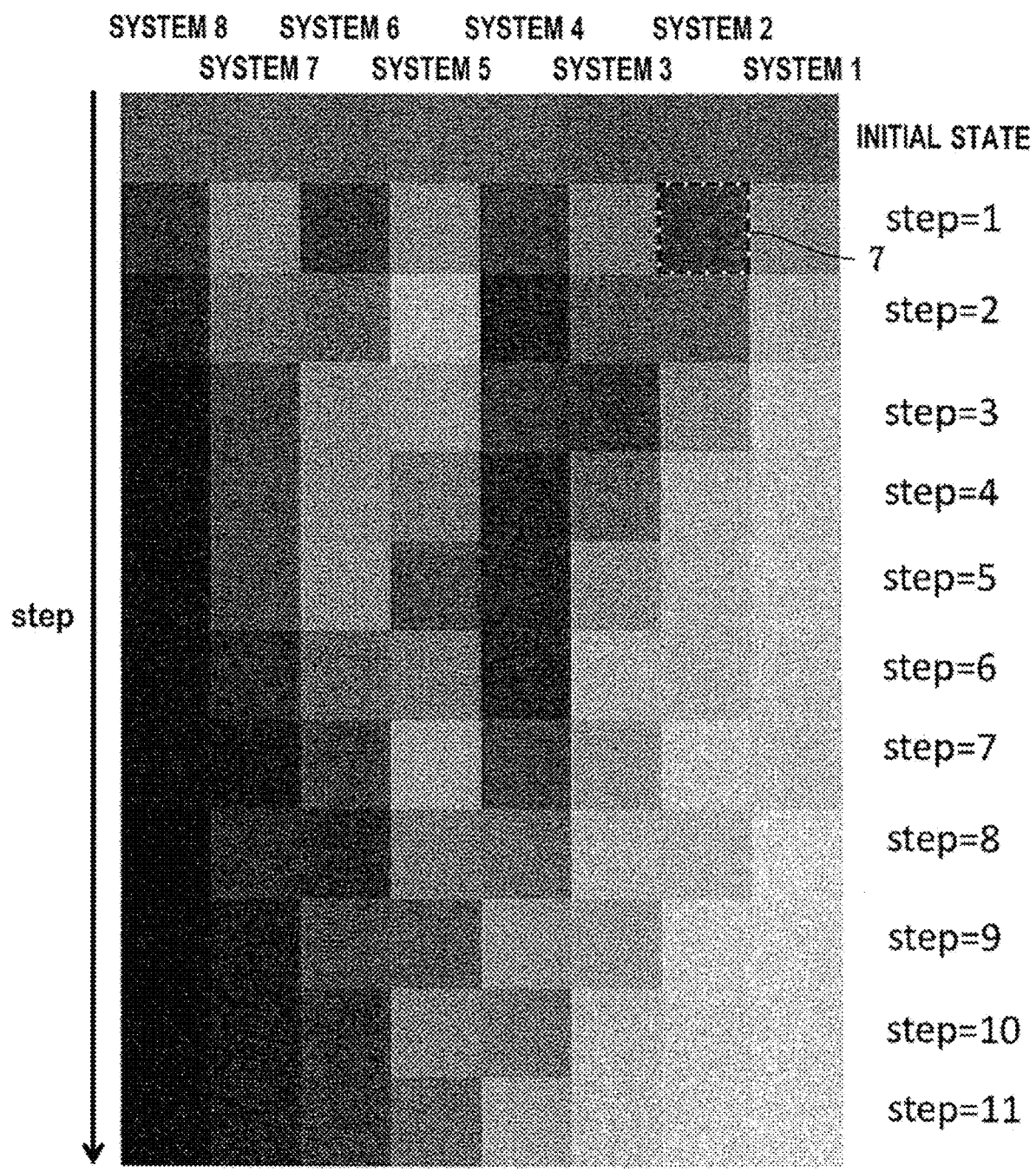
FIG. 6 is a diagram illustrating the time evolution of an expectation value of energy when one embodiment of the method of the present invention is performed (FIG. 5)

Next, steps S20 and S30 in FIG. 2 will be described in detail with reference to FIGS. 4 to 6. In other words, a method used by the quantum computer for solving the discrete optimization problem by applying the method of step S10 in FIG. 2 among the plurality of physical systems will be described. FIG. 4 is a schematic diagram of the conceptual diagram of FIG. 3. In FIG. 4, a black circle 4 and a white circle 5 are simplified descriptions corresponding to the first operation 1 to the third operation 3 in FIG. 3. FIG. 5 is a diagram illustrating step S20 of constructing the network structure among the plurality of physical systems in one embodiment of the method of the present invention and step S30 of obtaining the physical system having the minimum energy state among the plurality of physical systems. In FIG. 5, the states of the plurality of physical systems are displayed by using the simplified descriptions (black circle 4 and white circle 5) in FIG. 4. FIG. 6 is a diagram illustrating the time evolution of the expectation value of energy of a case (FIG. 5) in which the operation of step S10 is applied to all the physical system pairs in the network structure illustrated in FIG. 5 by causing the two physical systems (u, d) to correspond thereto, and the physical system having the minimum energy state in the plurality of physical systems is obtained.

m is set as a positive integer and 2m physical systems are considered. A network structure among the plurality of physical systems is constructed by the following procedure. FIG. 5 illustrates a case of m=4 (physical system 1 to physical system 8).

(1) A non-negative integer step starting from 0 is introduced. FIGS. 5 and 6 illustrate a state transfer in which step=0 is set as an initial state and step=1 to step=11 are sequentially increased by one.

(2) An integer $s_j$(step) determined by the following rules is introduced into a physical system of j-th (j is a positive integer equal to or less than 2m−1).

(2-1) $s_j(0)$ is set as 0 for all the physical systems j.

(2-2) A pair of a physical system j and a physical system j' which have a state value $s_j$(step)=$s_{j'}$(step) is selected from all the physical systems j and j' where j<j' (j' is a positive integer equal to or less than 2m). In FIG. 5, one line that connects a black circle and a white circle in a vertical direction (direction in which the physical systems 1 to 8 are arranged) represents one pair. For example, in the physical systems 1 and 3 of step=2, $s_1(2)=s_3(2)=-1$, and the physical system 1 and the physical system 3 are paired. In the same manner, in the physical system 4 and the physical system 7 of step=7, $s_4(7)=s_7(7)=+2$, and the physical system 4 and the physical system 7 are paired. Except for the physical system j and the physical system j' once paired, such pairs are collected as much as possible.

(2-3) A set having a plurality of pair of the physical systems configured as described above as an element is defined as Ω(step).

(2-4) With respect to the physical system j and physical system j' appearing in Ω(step), $s_j$(step+1) and $s_{j'}$(step+1) are defined as in the following equations (15) and (16).

$$s_j(\text{step}+1) = s_j(\text{step}) - 1 \quad (15)$$

$$s_{j'}(\text{step}+1) = s_{j'}(\text{step}) + 1 \quad (16)$$

In FIG. 5, for example, in a pair of the physical system 3 and the physical system 6 of step=5, $s_3(6)=s_3(5)-1=-1$, $s_6(6)=s_6(5)+1=0$. The same applies to the other pairs.

(2-5) With respect to j which does not appear in Ω(step), the following equation (17) is defined.

$$s_j(\text{step}+1) = s_j(\text{step}) \quad (17)$$

In FIG. 5, for example, from step=4 to step=7 of the physical system 1, $s_1(7)=s_1(6)=s_1(5)=s_1(4)s_1(3)=-3$. The same applies to others.

(2-6) Returning to the above-described (2-2) with step+1 as step, and (2-2) to (2-6) are repeated until the set Ω(step) becomes an empty set.

(2-7) A step obtained by subtracting 1 from a step where the set Ω (step) becomes the empty set is defined as step*. In FIG. 5, step=11 obtained by subtracting 1 from step=12 (final state) where the set Ω(step) becomes the empty set becomes step*. At this time, the following (18) is referred to as a network structure among the plurality of physical systems. This network structure (18) can be determined independently of the Hamiltonian H which desires to obtain a minimum eigenstate.

$$\bigcup_{\text{step}=0}^{\text{step}*} \Omega(\text{step}) \quad (18)$$

Further, the value of $s_j$(step*) in each physical system j can be obtained by the following equation (19) by a construction method for the network structure among the plurality of physical systems.

$$s_j(\text{step}) = \begin{cases} j - m - 1 & \text{for} \quad j \in \{1, \ldots, m\} \\ j - m & \text{for} \quad j \in \{m+1, \ldots, 2m\} \end{cases} \quad (19)$$

In FIG. 5, for example, in the physical system 4, $s_4$(step*)=$s_4(11)$=j−m−1=4−4−1=−1, and in the physical system 8, $s_8$(step*)=$s_8(11)$=j−m=8−4=+4.

The time evolution of the quantum state is performed by using the network structure among the plurality of physical systems constructed as described above and the operation of transferring the energy state of step S10 in FIG. 2 (an energy exchange method between the two physical systems having the same quantum state) as follows.

(1) The same quantum state is prepared as an initial state in 2m physical systems.

(2) Step=0 is set.

(3) The operation of transferring the energy state of step S10 is applied to all the physical system pairs {j, j'} (note that j<j') included in the set Ω(step) under the condition that the physical system j corresponds to the physical system u of step S10 (FIG. 3) in FIG. 2, and the physical system j' corresponds to the physical system d.

(4) Step+1 is returned to (3) as a new step, and repeated until step=step* is reached.

In this case, the above-described equations (10) and (11) are repeatedly applied, and the state of each step in each physical system j is represented by the following (20) in the approximate range up to the first order of τ and Δt by using solution (9) of equation (8).

$$|\varphi_{t-s_j(step)\Delta t}\rangle \langle \varphi_{t-s_j(step)\Delta t}| \tag{20}$$

The result of strictly computing the expectation value of energy at this time is shown in a diagram illustrating the time evolution of the expectation value of energy in FIG. 6. In FIG. 6, it is shown that one area surrounded by a broken line 7 represents the expectation value of energy; black and white shading represents the magnitude of the expectation value of energy; and as the color becomes darker, the expectation value of energy becomes smaller. Since FIG. 6 corresponds to the physical system of m=4 in FIG. 5, it can be seen that the expectation value of energy becomes minimum in step=11 of the physical system 8.

In step=step*, equation (19), equation (20), and equation (12) are monotonically decreasing with respect to t, whereby the expectation value of energy in the state of each physical system j is monotonously decreasing with respect to j. Among them, particularly, in the physical system of j=2m (physical system 8 in the example of FIG. 5), the lowest state of the expectation value of energy of the following (21) is realized as a result of the quantum mechanical time evolution defined by the series of operations described above.

$$|\varphi_{t\to m\Delta t}\rangle \langle \rho_{t\to m\Delta t}| \tag{21}$$

First Embodiment

Figure 7:
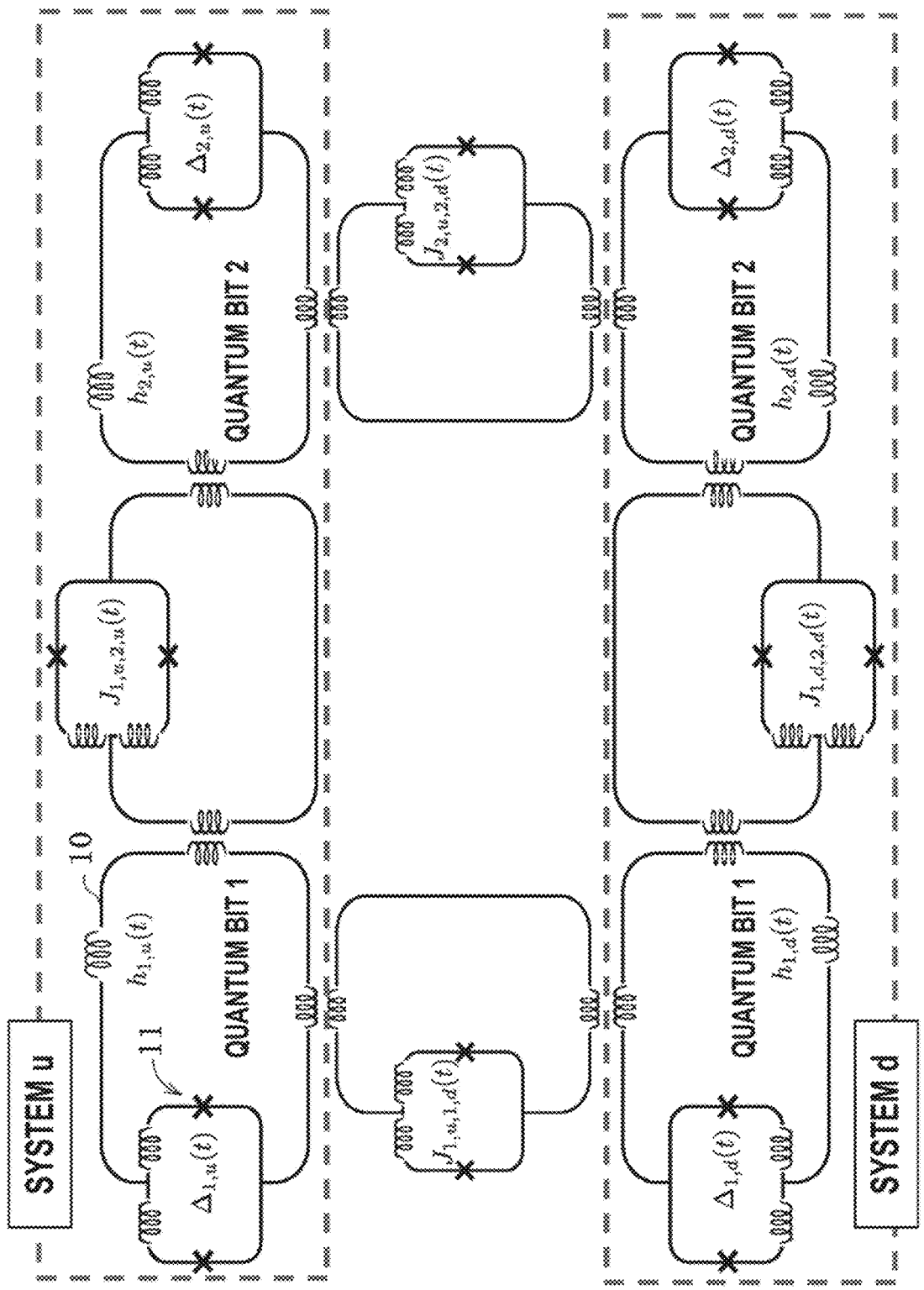
FIG. 7 is a diagram illustrating an implementation example (configuration example) in which the method of the present invention is applied to a superconducting circuit (CJJ-rf-SQUID) using Josephson junction.

As a first embodiment, an implementation example when the operation of step S10 in FIG. 2 is applied to a superconducting circuit using Josephson junction ("CJJ-rf-SQUID", Physical Review B 80,052506,2009) will be hereinafter described. FIG. 7 is a diagram illustrating the implementation example (configuration example). FIG. 7 illustrates an example of two quantum bits 1 and 2. In the physical system u and d, a superconducting loop 10 forming the quantum bits 1 and 2 includes a mini loop 11 including two Josephson junctions (x). In each of the superconducting loops 10, the similar superconducting loops are magnetically joined to each other through mutual inductance. Further, in the following description, a case in which two quantum bits i and j are more generally assumed will be described.

In the CJJ-rf-SQUID system, an interaction in the form of the following equation (22) can be formed between the two quantum bits i and j.

$$\hat{H}_{(i,j)} = 1/2[h_i(t)\hat{\sigma}_z^{(i)} + h_j(t)\hat{\sigma}_z^{(j)} + \Delta_i(t)\hat{\sigma}_x^{(i)} + \Delta_j(t)\hat{\sigma}_x^{(j)}] + J_{ij}(t)\hat{\sigma}_z^{(i)}\hat{\sigma}_z^{(j)} \tag{22}$$

Figure 8:
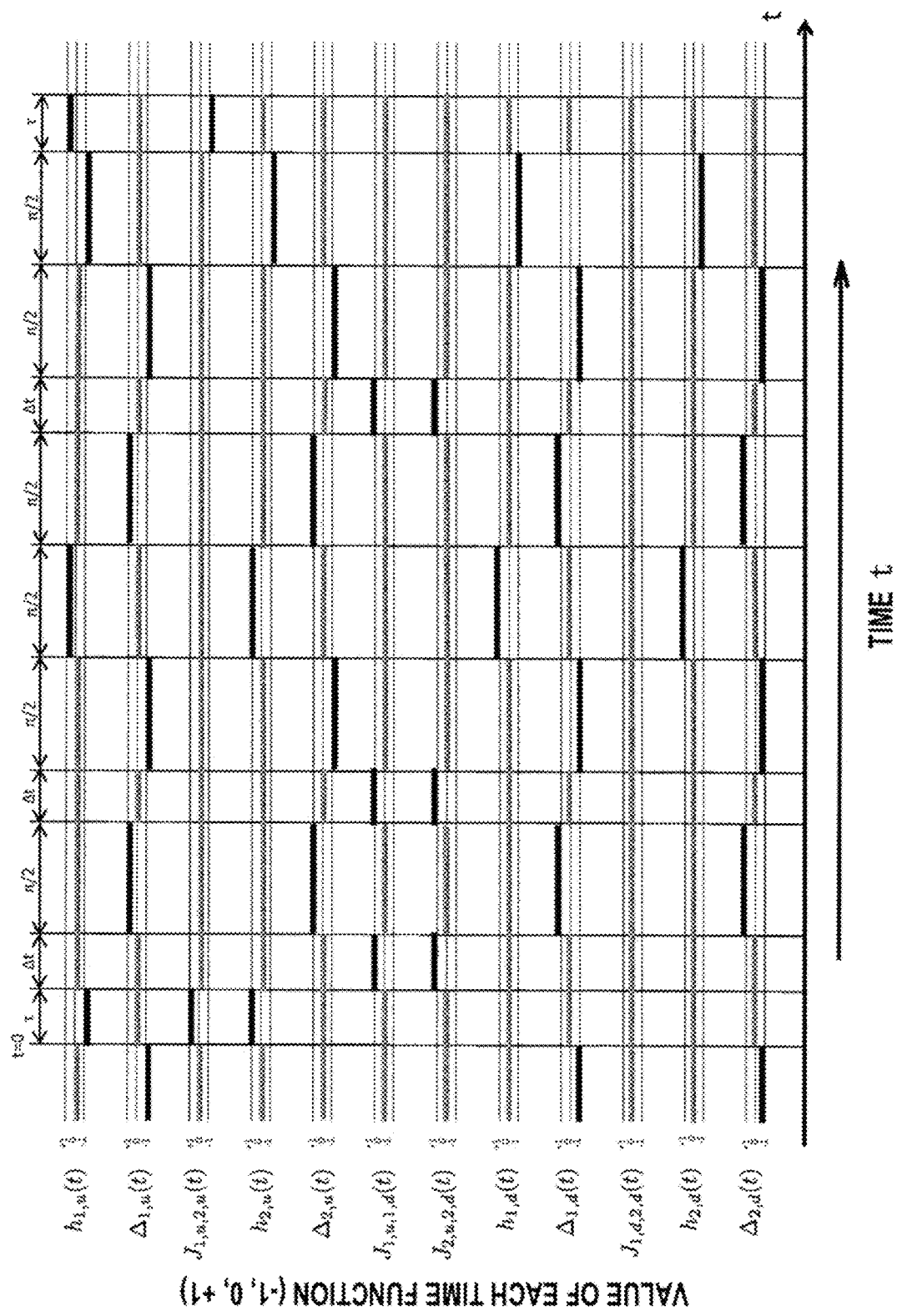
FIG. 8 is a diagram illustrating a control sequence of the embodiment of FIG. 7.

Here, each coefficient of the following (23) in equation (22) is a function of time which takes an integer value. FIG. 8 is a diagram illustrating the control sequence of the embodiment in FIG. 7, that is, the time transfer of values (−1, 0, +1) of each coefficient of the following (23).

$$h_i(t),h_j(t),\Delta_i(t),\Delta_j(t),J_{ij}(t) \tag{23}$$

Further, each coefficient of the following (24) is a Pauli matrix of the quantum bit i.

$$\hat{\sigma}_x^{(i)},\hat{\sigma}_y^{(i)},\hat{\sigma}_z^{(i)} \tag{24}$$

A set of quantum bits in which the interaction of the above-described equation (22) is realized is considered. The set of these quantum bits is divided into two, and one is caused to correspond to the physical system u and the other is caused to correspond to the physical system d. At this time, a label of the quantum bit i belonging to the physical system u is defined as (i, u), and a label of the quantum bit i belonging to the physical system d is defined as (i, d). That is, the interaction between these quantum bits is represented as the following equation (25).

$$\sum_{q\in\{u,d\}}\sum_i \frac{1}{2}(h_{i,q}(t)\hat{\sigma}_z^{(i,q)}+\Delta_{i,q}(t)\hat{\sigma}_x^{(i,q)}) + \sum_{q\in\{u,d\}}\sum_{q'\in\{u,d\}}\sum_{i,j}J_{i,q,j,q'}\hat{\sigma}_z^{(i,q)}\hat{\sigma}_z^{(j,q')} \tag{25}$$

At this time, in the same manner as the case of the quantum annealing computation, in the interaction of equation (25) at t<0, the following equation (26) is introduced and other coefficients are set to 0, thereby preparing an initial state (range of t<0 in FIG. 8).

$$\Delta_{i,u}(t)=\Delta_{i,d}(t)=-1 \tag{26}$$

In the same manner as the case of the quantum annealing computation, corresponding to the above-described first operation, the Hamiltonian of equation (4) is realized as shown in the following equation (27) by using the interaction between the quantum bits forming the physical system u in equation (25).

$$\hat{H} = \sum_i \frac{1}{2}h_{i,u}\hat{\sigma}_z^{(i,u)} + \sum_{i,j}J_{i,u,j,u}\sigma_z^{(i,u)}\sigma_z^{(j,u)} \tag{27}$$

That is, the following equations (28) and (29) are set for time τ (for time τ in FIG. 8), thereby completing the first operation.

$$h_{i,u}(t)=h_{i,u}, J_{i,u,j,u}(t)=J_{i,u,j,u} \tag{28}$$

$$h_{i,d}(t)=\Delta_{i,u}(t)=\Delta_{i,d}(t)=J_{i,u,j,u}(t)=J_{i,u',j,u'(t)}=0 \tag{29}$$

Corresponding to the above-described second operation, a swapping operation is performed. The swapping operation forms the interaction of the following equation (30) between the quantum bits forming the physical system u and the physical system d in equation (25), and is set for the time Δt, thereby completing the second operation.

$$\hat{S}_{ud} = \frac{1}{2}\left(I + \sum_i (\hat{\sigma}_x^{(i,u)}\hat{\sigma}_x^{(i,d)} + \hat{\sigma}_y^{(i,u)}\hat{\sigma}_y^{(i,d)} + \hat{\sigma}_z^{(i,u)}\hat{\sigma}_z^{(i,d)})\right) \tag{30}$$

However, the interaction of equation (30) cannot be directly realized by the interaction in the form of equation (25). Therefore, when the following equations (31) to (34)

are paid attention to, in the range up to the first order of $\Delta t$ that establishes equation (6) and equation (7), the second operation can be implemented indirectly by performing the following operations (1) to (3) in order.

$$e^{-i\hat{S}_{ud}\Delta t} = e^{-i\frac{\Delta t}{2}} U_x U_y U_z + O(\Delta t^2) \quad (31)$$

$$U_z = \exp\left(-i\frac{\Delta t}{2}\sum_i \hat{\sigma}_z^{(i,u)}\hat{\sigma}_z^{(i,d)}\right) \quad (32)$$

$$U_y = e^{-i\frac{\pi}{2}\sum_i (\sigma_x^{(i,u)}+\sigma_x^{(i,d)})} U_z e^{+i\frac{\pi}{2}\sum_i (\sigma_x^{(i,u)}+\sigma_x^{(i,d)})} \quad (33)$$

$$U_x = e^{-i\frac{\pi}{2}\sum_i (\sigma_z^{(i,u)}+\sigma_z^{(i,d)})} U_y e^{+i\frac{\pi}{2}\sum_i (\sigma_z^{(i,u)}+\sigma_z^{(i,d)})} \quad (34)$$

(1) Operation of Equation (32):
In equation (25), as the following equation (35), all the remaining coefficients are set to 0 for time $\Delta t$ (for the first $\Delta t$ in FIG. 8). Accordingly, the operation of equation (31) is completed.

$$J_{i,u,i,d}(t)=1 \quad (35)$$

(2) Operation of Equation (33):
In equation (25), as the following equation (36), all the remaining coefficients are set to 0 for time $\pi/2$ (for the first $\pi/2$ in FIG. 8). After that, as equation (35), all the remaining coefficients are set to 0 for time $\Delta t$ (for the second $\Delta t$ in FIG. 8).

$$\Delta_{i,u}(t)=\Delta_{i,d}(t)=1 \quad (36)$$

Further, as the following equation (37), all the remaining coefficients are set to 0 for time $\pi/2$ (for the second $\pi/2$ in FIG. 8). Accordingly, the operation of equation (33) is completed.

$$\Delta_{i,u}(t)=\Delta_{i,d}(t)=-1 \quad (37)$$

(3) Operation of Equation (34):
In equation (25), as the following equation (38), all the remaining coefficients are set to 0 for time $\pi/2$ (for the third $\pi/2$ in FIG. 8).

$$h_{i,u}(t)=h_{i,d}(t)=1 \quad (38)$$

Thereafter, as equation (36), all the remaining coefficients are set to 0 and time $\pi/2$ is allowed to elapse (for the fourth $\pi/2$ in FIG. 8), and then as equation (35), all the remaining coefficients are set to 0 for time $\Delta t$ (for the third $\Delta t$ in FIG. 8). Further, as equation (37), all the remaining coefficients are set to 0 and time $\pi/2$ is allowed to elapse (for the fifth $\pi/2$ in FIG. 8), and further, as the following equation (39), all the remaining coefficients are set to 0 for time $\pi/2$ (for the last $\pi/2$ in FIG. 8).

$$h_{i,u}(t)=h_{i,d}(t)=-1 \quad (39)$$

Accordingly, the operation of equation (34) is completed. The second operation is completed by the above-described series of operations (1), (2), and (3).

Corresponding to the above-described second operation, the interaction of equation (5) is set for time interval $\tau$ by using the interaction between the quantum bits forming the physical system u in equation (25). Since this is formed by the inversion of equation (27), the following equation (40) may be set corresponding to equation (28). Accordingly, the third operation is completed.

$$h_{i,d}(t)=-h_{i,u}, J_{i,u,j,u}(t)=-J_{i,u,j,u} \quad (40)$$

As described above, in order to use the method (operation) of step S10 in FIG. 2 by the implemented CJJ-rf-SQUID for the quantum computation by being repeatedly applied to 2m physical systems, the method can be used (implemented) by using the above-described series of processes with reference to FIGS. 4 to 6.

Second Embodiment

Next, as a second embodiment, in order to evaluate the number of computation steps and the required number of quantum bits, a case in which the present invention is applied to a search problem of a search space $2^n$ will be described. First, the Hamiltonian of the following equation (41) corresponding to the search problem is applied to the nonlinear equation of equation (8).

$$\hat{H}=-\omega_0|\omega_0\rangle\langle\omega_0|, \omega_0>0 \quad (41)$$

Figure 9:
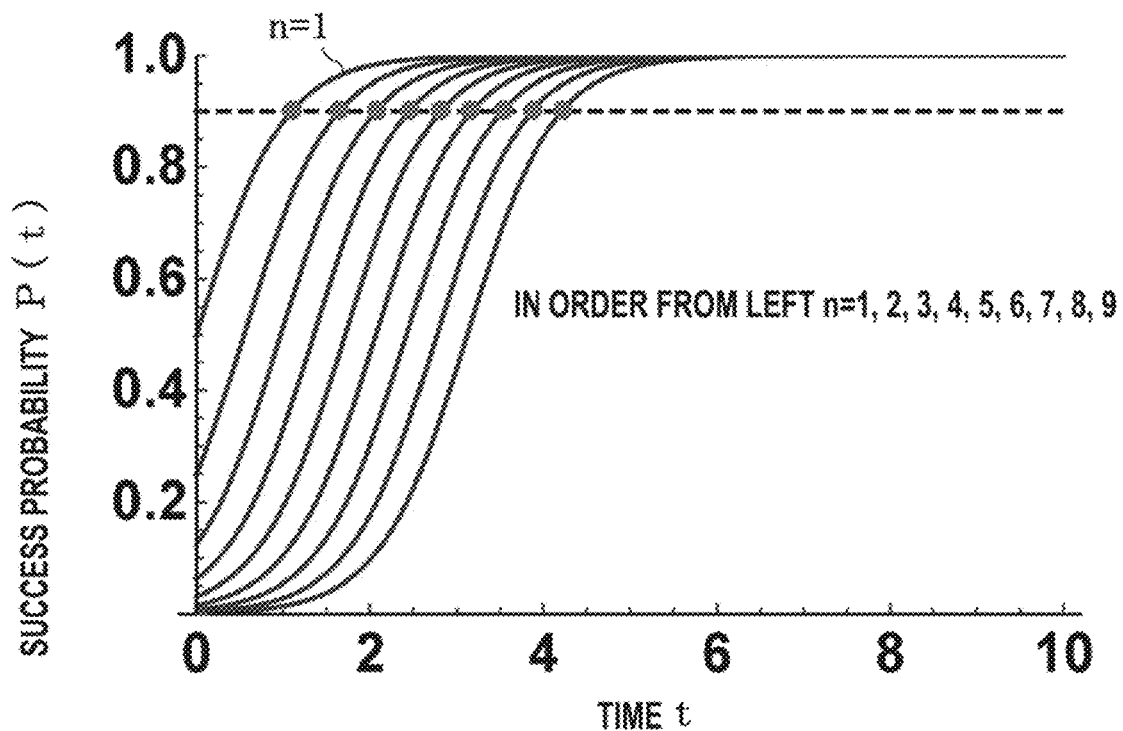
FIG. 9 is a diagram illustrating n dependency of a temporal behavior of a correct solution probability P(t) of a search problem by a nonlinear equation.

When the correct solution probability of the following equation (42) at time t is computed, an analytical solution exists and thus the following equation (43) is obtained. FIG. 9 is a diagram illustrating n dependency of a temporal behavior of a correct solution probability P(t) of the search problem based upon the nonlinear equation, obtained by plotting P(t) of equation (43).

$$P(t) := |\langle\omega_0 | \varphi_i\rangle|^2 \quad (42)$$

$$P(t) = \frac{1}{1 + (P(0)^{-1} - 1)\exp(-2\omega_0\tau t)} \quad (43)$$

Here, considered is a case where a size of a solution space is the following (44) and an initial correct solution probability is represented by the following equation (45).

$$2^n \quad (44)$$

$$P(0)=2^{-n} \quad (45)$$

Figure 10:
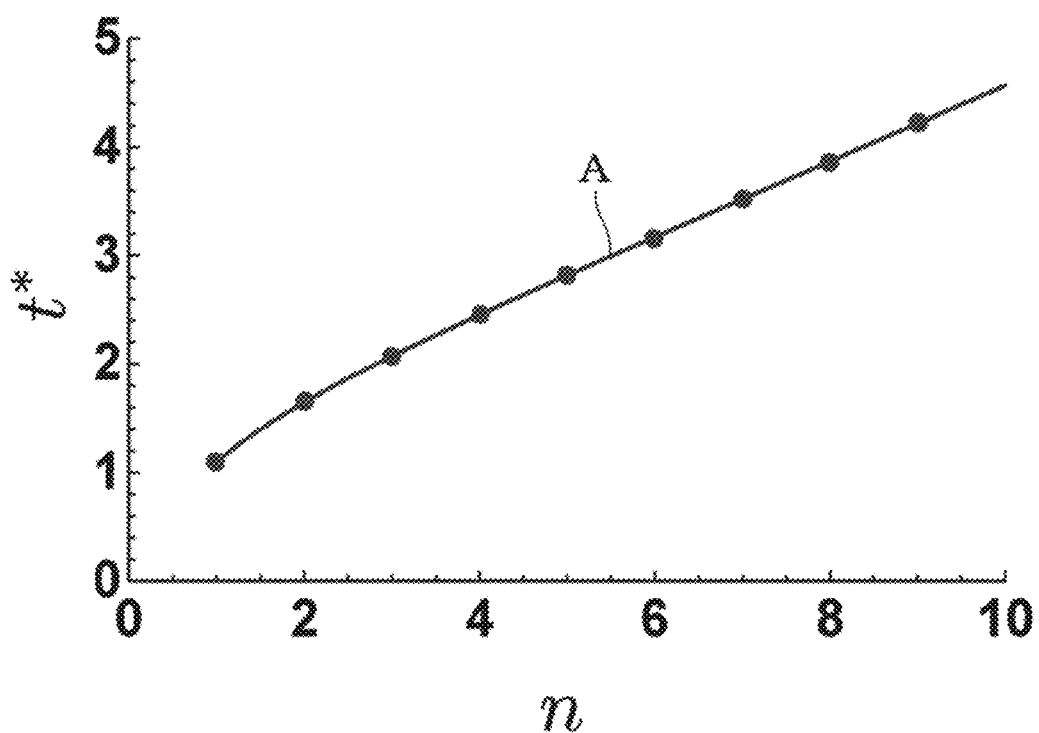
FIG. 10 is a diagram illustrating n dependency of time t* when the correct solution probability P(t) becomes P(t)≥0.9.

At this time, when time t satisfying the following equation (46) is defined as t*, t* is obtained as the following equation (47). FIG. 10 illustrates a plot of t* in equation (47), and a graph A shows n dependency of time t* when the correct solution probability $P(t) \geq 0.9$.

$$P(t) \geq \epsilon \quad (46)$$

$$t^* = \frac{1}{2\omega_0\tau}\left(\ln\frac{1-\epsilon}{\epsilon} + \ln(2^n - 1)\right) = O\left(\frac{n}{\omega_0\tau}\right) \quad (47)$$

Here, according to a fact that the state obtained by this example is equation (21), when m corresponding to t* of equation (47) is set to m*, the following equation (48) can be obtained.

$$m^* = \frac{1}{2\omega_0\tau\Delta t}\left(\ln\frac{1-\epsilon}{\epsilon} + \ln(2^n - 1)\right) = O\left(\frac{n}{\omega_0\tau\Delta t}\right) \quad (48)$$

When noting that a relationship between step* and m is the following equation (49) regardless of the details of the Hamiltonian (H), it can be seen that the step* determined by m* is represented by the following equation (50), which indicates the second order (n²) of n.

$$\text{step}^* = O(m^2) \tag{49}$$

$$\text{step}^* = O\left(\frac{n^2}{\omega_0^2 \tau^2 \Delta t^2}\right) \tag{50}$$

Further, since the number of quantum bits per system required for representing the problem of equation (43) is n pieces, the following equation (51) is obtained for the whole 2m* system.

$$2m^*n = O\left(\frac{n^2}{\omega_0 \tau \Delta t}\right) \tag{51}$$

Figure 11:
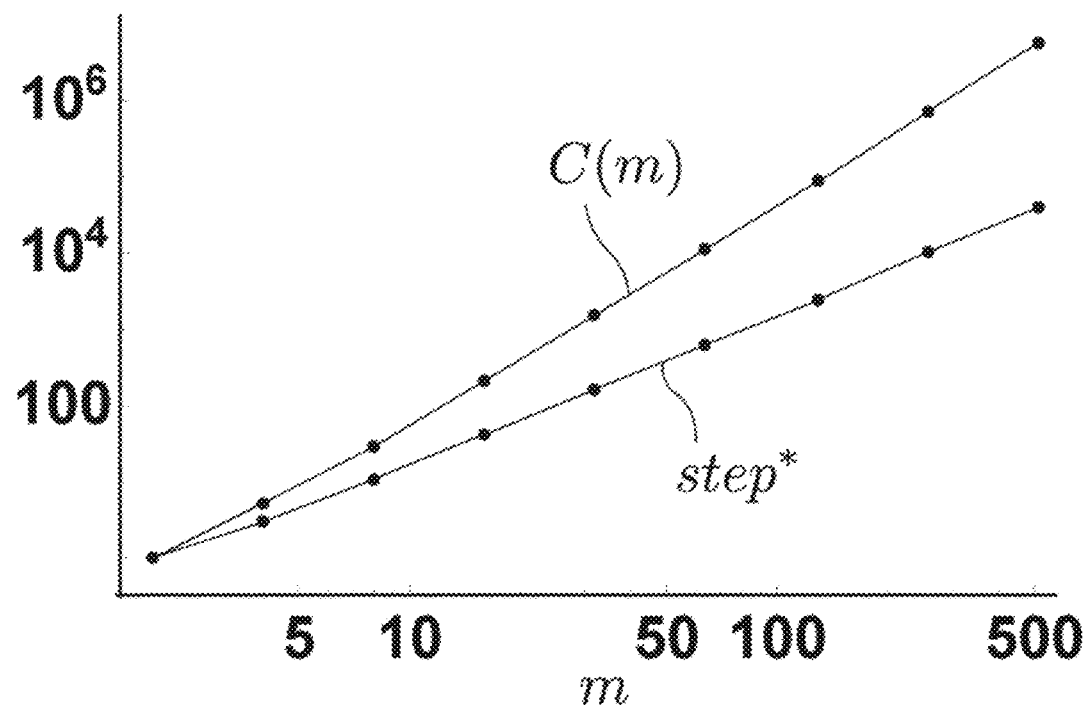
FIG. 11 is a diagram illustrating m dependency of step* obtained by subtracting 1 from step where Ω(step) becomes an empty set and the number of quantum operations C(m).

Further, since the number C(m) of quantum operations required for the given m is the following equation (52), the following equation (53) is obtained when applied to the search problem. FIG. 11 is a diagram illustrating m dependency of the step* obtained by plotting equation (50) and the number C(m) of quantum operations obtained by plotting equation (53).

$$C(m) = \sum_{step=1}^{step^*} |\Omega(\text{step})| = O(m^3) \tag{52}$$

$$C(m^*) = O\left(\frac{n^3}{\omega_0 \tau \Delta t}\right) \tag{53}$$

When the conventional quantum annealing computation is applied to the search problem of the search space $2^n$ and the gate type quantum computation search problem, it is known that the number of computation steps is $2^{n/2}$ (even though the number is smaller than that of computation that does not use quantum) and behaves exponentially with respect to n. On the other hand, as described above, the number of computation steps (step*) according to the present invention is suppressed in a highly polynomial manner (for example, n²) with respect to n. In the same manner, the number of quantum bits required for the computation is proportional to n² in the present invention, whereas the conventional computation method is approximately proportional to n. Further, the problem can be solved by the number of computation steps and the required number of quantum operations (C(m)) in a highly polynomial size (for example, n³) with respect to n.

Embodiments of the present invention have been described with reference to the accompanying drawings. However, the present invention is not limited to the embodiments. Further, the present invention can be implemented in a manner to which various improvements, corrections, and modification are added based upon the knowledge of those skilled in the art without departing from the spirit of the present invention.

What is claimed is:

1. A method for performing quantum annealing computation to solve a discrete optimization problem using a quantum annealing computer comprising the step of;
   (a) identifying an operation for transferring energy state of one of two physical systems (u, d) having a same quantum state to a low energy state and transferring energy state of the other of the two physical systems to a high energy state;
   (b) constructing a network structure among a plurality of physical systems that indicates an order of application of the operation of the step (a) on two physical systems among the plurality of physical systems;
   (c) obtaining a physical system having a minimum energy state in the plurality of physical systems by applying the operation of the step (a) to the plurality of physical systems according to the order indicated in the network structure of step (b).

2. A method for performing quantum annealing computation according to the claim 1, wherein the step (a) comprises the step of
   (a1) giving the same quantum state as an initial state to the two physical systems (u, d);
   (a2) performing time evolving of the quantum state of the physical system u for a time τ (>0) using a Hamiltonian (H);
   (a3) performing a quantum swapping operation between physical system u and physical system d for time Δt (>0); and
   (a4) performing time evolving of the quantum state of the physical system u for time τ (>0) using an inverted Hamiltonian (−H).

3. A method for performing quantum annealing computation according to the claim 2, wherein the step (c) comprises the step of
   (c1) giving a same quantum state as an initial state to 2m physical systems (m is a positive integer);
   (c2) setting step=0, and
   (c3) applying an operation including the steps (a1) to (a4) to all the physical system pairs (j, j') in the set Ω (step), under the condition that the physical system j corresponds to the physical system u and the physical system j' corresponds to the physical system d.

4. A method for performing quantum annealing computation according to the claim 1, wherein the step (b) comprises the step of
   (b1) defining a state value of j-th physical system j (j is a positive integer equal to or less than 2m−1 and m is a positive integer) as j (step) in 2m physical systems and setting s j (0)=0 for all physical systems j;
   (b2) selecting a plurality of pairs of the physical system j and the physical system j' which have a state value sj (step)=s j' (step), from all the physical systems j and j' where j<j' (j, j' is a positive integer of 2 m or less);
   (b3) collecting the plurality of pairs of the physical system j and the physical system j' as a set Ω (step);
   (b4) setting the physical system j and physical system j' included in the set Ω (step) to s j (step+1)=s j (step)−1,s j' (step+1)=s j' (step)+1;
   (b5) setting the physical system j not included in the set Ω (step) to s j (step+1)=s j (step) and step+1 to step;
   (b6) repeating the steps (b2) to (b5) until the set Ω (step) becomes an empty set; and
   (b7) setting a step obtained by subtracting 1 from the step in which the set Ω (step) is an empty set, to a step *.

5. A method for performing quantum annealing computation according to the claim 4, wherein the state value s j (step *) in each of the physical system j is given as
   s j (step *)=j−m−1 (j=1, 2, . . . , m) or
   s j (step *)=j−m (j=m+1, m+2, . . . , 2m).

* * * * *